(12) United States Patent
Chao

(10) Patent No.: US 6,759,753 B2
(45) Date of Patent: Jul. 6, 2004

(54) MULTI-CHIP PACKAGE

(75) Inventor: Yuan-Jen Chao, Kaohsiung (TW)

(73) Assignee: Gigno Technology Co., Ltd., Taipei (TW)

( * ) Notice: Subject to any disclaimer, the term of this patent is extended or adjusted under 35 U.S.C. 154(b) by 0 days.

(21) Appl. No.: 10/442,281

(22) Filed: May 21, 2003

(65) Prior Publication Data

US 2003/0222342 A1 Dec. 4, 2003

(30) Foreign Application Priority Data

May 31, 2002 (TW) ........................................ 91111767 A

(51) Int. Cl.⁷ .............................................. H01L 23/28
(52) U.S. Cl. ...................... 257/787; 257/666; 257/723; 257/781; 257/784
(58) Field of Search ................................ 257/723, 787, 257/780, 781, 784, 666

(56) References Cited

U.S. PATENT DOCUMENTS

| 4,729,010 | A | * | 3/1988 | Tsuchiya et al. | ............ | 257/712 |
| 4,827,328 | A | * | 5/1989 | Ozawa et al. | ............... | 174/68.5 |
| 5,489,059 | A | * | 2/1996 | Rostoker et al. | ............. | 228/175 |
| 6,130,448 | A | * | 10/2000 | Bauer et al. | ................. | 257/222 |
| 6,239,366 | B1 | * | 5/2001 | Hsuan et al. | ............... | 174/52.3 |
| 6,259,157 | B1 | * | 7/2001 | Sakamoto et al. | ........... | 257/723 |
| 6,621,172 | B2 | * | 9/2003 | Nakayama et al. | ......... | 257/787 |

* cited by examiner

Primary Examiner—Jasmine Clark
(74) Attorney, Agent, or Firm—Birch, Stewart, Kolasch & Birch, LLP

(57) ABSTRACT

A multi-chip package includes a transparent substrate, at least two chips, a plurality of connecting terminals, and a molding compound. In this case, the transparent substrate has a conductive layer for electrical inter-connection. The chips are mounted on the transparent substrate, so that the chips and the conductive layer form a circuitry system. At least one of the chips is provided on the transparent substrate by way of flip-chip attachment. The connecting terminals electrically connect to the circuitry system through a plurality of wires. Thus, the circuitry system electrically connects to external devices with the wires and connecting terminals. The molding compound at least encapsulates the wires.

10 Claims, 2 Drawing Sheets

MULTI-CHIP PACKAGE

This nonprovisional application claims priority under 35 U.S.C. §119(a) on Patent Application No(s). 091111767 filed in TAIWAN on May 31, 2002, which is (are) herein incorporated by reference.

BACKGROUND OF THE INVENTION

1. Field of Invention

The invention relates to a multi-chip package and, in particular, to a multi-chip package having a transparent substrate.

2. Related Art

As an electrical system increases its functionality and at the same time becomes more compact, conventional IC package and PCB (printed circuit board) assembling technologies are no longer able to satisfy the need for reducing the system size. As a result, an obvious trend is to integrate multiple complex functions in a single IC chip.

Conventional IC fabrication technology, however, utilizes variant sets of processes to fabricate IC chips having different functions. For example, processes for a logic IC are very different from those for a memory IC. Therefore, it is difficult to integrate a logic IC and a memory IC in one single IC chip, and still maintain adequate performance. Consequently, a new technique for packaging different chips into a single package known to those skilled in the art as a multi-chip package (MCP) is disclosed.

As multi-chip package technology develops, the IC chips in a single package can perform powerful functions, such that they can already be considered as a system. Such a package having multiple chips with a system level function is known as a system in package (SIP).

Presently, there are a variety of multi-chip package types, and different manufacturing methods thereof. Two types of multi-chip packages will be described hereinbelow to illustrate the structures and disadvantages thereof.

In the first case, a multi-chip package employing a lead frame to carry IC chips is described. With reference to FIG. 1, a conventional multi-chip package 1 includes a lead frame 11, at least two IC chips 13, a plurality of wires 15, and a molding compound 17. Each IC chip 13 is attached to the lead frame 11. The wires 15 respectively bond the IC chips 13 to leads or fingers of the lead frame 11. The molding compound 17 encapsulates the lead frame 11, IC chips 13 and wires 15. In the multi-chip package 1, each IC chip 13 is interconnected to the leads or fingers of the lead frame 15. In more detail, the wires 15 bond each IC chip 13 to the lead frame 11, so that the IC chips 13 can interconnect to each other via the leads or fingers of the lead frame 11. People skilled in the art should know that processes for manufacturing the multi-chip package 1 are similar to processes for manufacturing a conventional single-chip package. The lead frame 11, however, has limitation due to the conventional manufacturing technology, and it is difficult to manufacture a lead frame having fine pattern. Therefore, the lead frame is poorly suited for high pin-count chips. Moreover, since the lead frame 11 is a single layer structure, the leads or fingers of the lead frame 11 cannot cross over each other. As a result, the complexity and flexibility of the layout that the leads or the fingers can provide is restricted. To solve the previously mentioned problem, additional wires can be used to bond one lead or finger to another for connecting the leads or fingers as desired. However, this may make manufacturing processes more complex, and the size of the multi-chip package 1 may be further enlarged.

In the second case, another multi-chip package employing a BGA (Ball Grid Array) substrate to carry IC chips is described. With reference to FIG. 2, an additional multi-chip package 2 includes a BGA substrate 21, at least two IC chips 23, a plurality of wires 25, and a molding compound 27. The BGA substrate 21 is composed of a usual resin material. A plurality of fingers and trace lines are formed on the upper surface of the BGA substrate 21, and a plurality of solder balls 211 are formed on the bottom of the BGA substrate 21. Each IC chip 23 is mounted on the upper surface of the BGA substrate 21. The wires 25 bond the IC chips 23 to the fingers of the BGA substrate 21, respectively. The molding compound 27 encapsulates the BGA substrate 21, IC chips 23, and wires 25. In the multi-chip package 2, the IC chips 23 are interconnected to each other through the fingers and trace lines of the BGA substrate 21. In more detail, the wires 25 bond each IC chip 23 to the fingers of the BGA substrate 21, so that the IC chips 23 can interconnect to each other via the trace lines, which connect to the fingers. Each IC chip 23 can then electrically connect to external devices through the fingers, trace lines, and solder balls. People skilled in the art should know that the BGA substrate 21 has a plurality of conductive layers for forming the trace lines, so that a complex circuitry and the fine pattern can be provided between the IC chips. Furthermore, the IC chips 23 can be attached to the BGA substrate 21 by way of a flip-chip attachment (not shown). Thus, the wires 25 can be eliminated. In such a case, the manufacturing process of the multi-chip package 2 is simplified, and the size of the multi-chip package 2 is efficiently controlled. However, the BGA substrate has a higher production cost. In addition, the BGA substrate 21 composed of resin material has a thermal expansion coefficient higher than that of each IC chip 23, which is made of silicon. Thus, when the IC chips 23 are attached to the BGA substrate 21 by way of a flip-chip attachment, the reliability of the multi-chip package 2 may be degraded accordingly.

Moreover, since the insulating property of the BGA substrate 21 is limited, high frequency signals transmitted in the fingers and trace lines may decay easily due to parasitic capacitance and parasitic leakage resistance.

In summary, since the conventional multi-chip package usually employs a lead frame or a BGA substrate to carry IC chips and provide circuits for connecting each IC chip, the conventional multi-chip package does not provide fine pattern (as in the case of the lead frame), or requires a higher production cost (as in the case of the BGA substrate). In addition, the conventional multi-chip package, especially for the case of using the BGA technology, still has the problems of high-frequency signal decay and degraded reliability. Thus, it is an important objective of the invention to solve the previously mentioned problems when employing the lead frame or BGA substrate.

SUMMARY OF THE INVENTION

In view of the above-mentioned problems, an objective of the invention is to provide a multi-chip package, which has a circuit of fine pattern.

It is another objective of the invention to provide a multi-chip package, which efficiently reduces high frequency signal decay caused by parasitic capacitance and parasitic leakage resistance.

It is a further objective of the invention to provide a multi-chip package, which prevents degraded reliability due to the difference between the thermal expansion coefficients of the materials inside the multi-chip package.

To achieve the above-mentioned objectives, a multi-chip package includes a transparent substrate, at least two chips, a plurality of connecting terminals, and a molding compound. In the invention, the transparent substrate has a conductive layer for electrical inter-connection. The chips are mounted on the transparent substrate, wherein at least one of the chips is provided on the transparent substrate by way of a flip-chip attachment. The chips and the conductive layer form a circuitry system. The connecting terminals electrically connect to the circuitry system through a plurality of wires, so that the circuitry system can electrically connect to external devices through the wires and connecting terminals. The molding compound at least encapsulates the wires.

Since the multi-chip package of the invention employs the transparent substrate, such as a glass substrate, to carry the chips, the conductive layer with fine pattern can be formed on the transparent substrate by utilizing existing manufacturing technology. Moreover, the transparent substrate, especially the glass substrate, has a good insulation property and a low dielectric constant, so that high frequency signal decay caused by parasitic capacitance and parasitic leakage resistance can be reduced efficiently. Furthermore, since the glass substrate and the semiconductor chip have very similar thermal expansion coefficients, the reliability issue caused by the difference between the thermal expansion coefficients of the materials can be avoided.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The multi-chip package according to the preferred embodiments of the invention will be described hereinbelow with reference to the accompanying drawings, wherein the same reference numbers refer to the same elements.

A multi-chip package according to a preferred embodiment of the invention includes a transparent substrate, at least two chips, a plurality of connecting terminals, and a molding compound.

In the invention, each of the chips is disposed on the transparent substrate by way of a wire bonding technology, a flip-chip attachment, or another packaging technology. Multi-chip packages of the invention manufactured by way of a wire bonding technology and a flip-chip attachment are described in greater detail with reference to the following embodiments.

Figure 1:
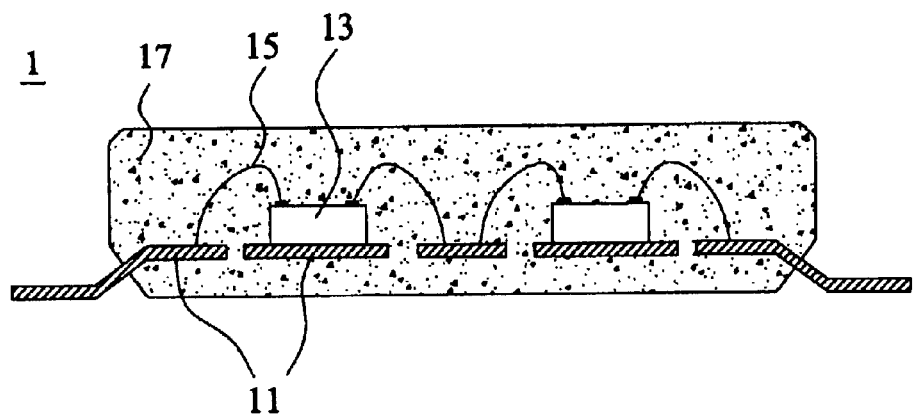
FIG. 1 is a schematic illustration showing a conventional multi-chip package having a lead frame to carry IC chips.
Figure 2:
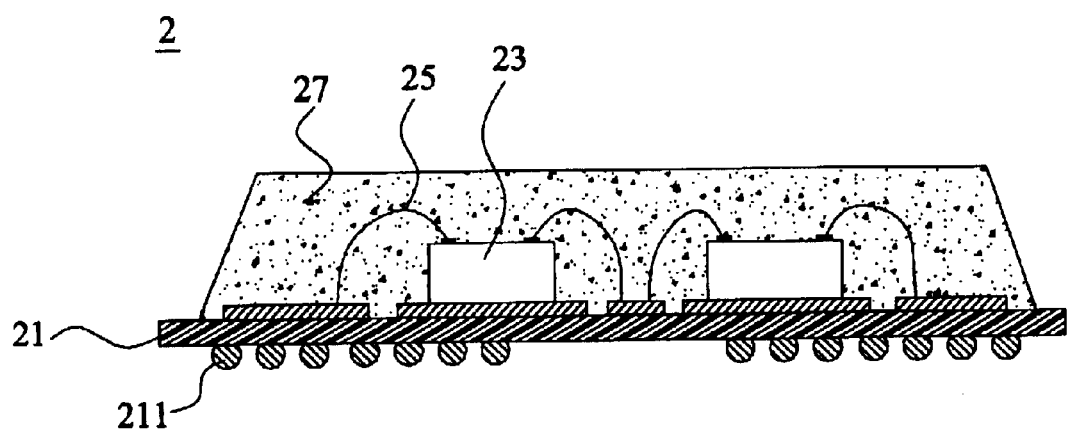
FIG. 2 is a schematic illustration showing a further conventional multi-chip package having a BGA substrate to carry IC chips.
Figure 3:
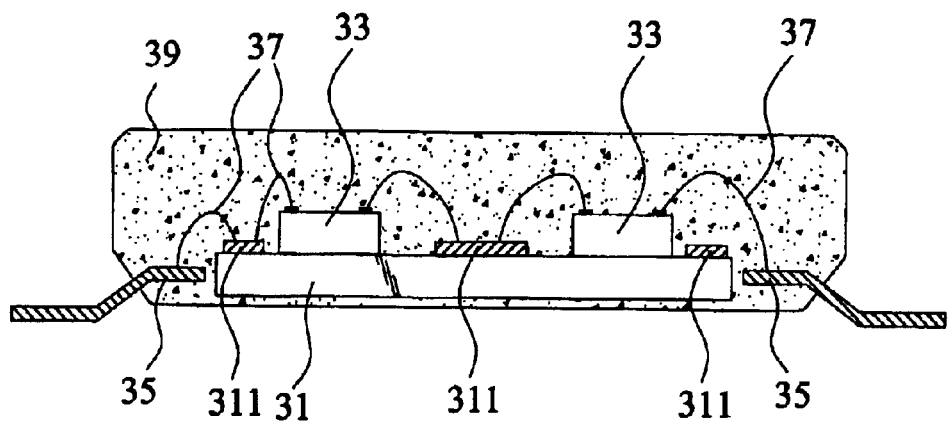
FIG. 3 is a schematic illustration showing a multi-chip package according to a preferred embodiment of the invention, wherein each chip electrically connects to a conductive layer of a transparent substrate by way of a wire bonding technology.

With reference to FIG. 3, a multi-chip package 3 according to a preferred embodiment of the invention includes a transparent substrate 31, two chips 33, a plurality of connecting terminals 35, a plurality of wires 37, and a molding compound 39. In the current embodiment, the transparent substrate 31 is a glass substrate. A conductive layer 311, which provides a circuit pattern of a desired layout, is formed on the upper surface of the transparent substrate 31. Since the transparent substrate 31 is made of glass, it is possible to form a circuit of fine pattern on the transparent substrate 31 by utilizing the existing manufacturing technologies. In other words, the conductive layer 311 including a circuit of fine pattern can be formed. People skilled in the art should know that the conventional lead frame only provides a minimum pattern of around 100 $\mu$m, and the conventional BGA substrate provides a minimum pattern of no less than 30 $\mu$m. In the multi-chip package 3, the glass substrate can provide a minimum pattern of 3 $\mu$m or even down to 1 $\mu$m by utilizing the existing manufacturing technology. The conductive layer 311 of the embodiment is composed of conductive material such as a metallic or alloy material.

Moreover, by utilizing the existing manufacturing technologies, multi-layer conductive patterns on the glass substrate (not shown) can be formed. In such a case, an insulating layer, such as a silicon nitride layer, a silicon oxide layer, or the likes, is formed between each layer of the conductive pattern. The insulating layer has a plurality of via holes, so that each layer of conductive pattern can electrically connect to another layer through the via holes. As a result, a more complex circuit layout design can be employed to achieve a powerful system in the multi-chip package 3.

Following the above, a pad can further be formed on the bottom of the transparent substrate 31 to carry the transparent substrate 31 (not shown).

The chips 33 are attached to the transparent substrate 31 with an adhesive, and each chip 33 electrically connects to the conductive layer 311 of the transparent substrate 31 through the wires 37. Consequently, the chips 33 can communicate and transmit signals to each other via the circuit layout of the conductive layer 311. The chips 33 and the conductive layer 311 form the desired circuitry system, and the powerful functionality of the circuitry system can be attained. In this embodiment, each chip 33 can be a logic IC device, a memory IC device or an optoelectronic IC device such as a photo diode.

The connecting terminals 35 can be positioned at the periphery of the transparent substrate 31, and electrically connect to the conductive layer 311 of the transparent substrate 31 through the wires 37. Therefore, each chip 33 can electrically connect to and transmit signals to external devices through the conductive layer 311, the wires 37 and the connecting terminals 35. In addition, as shown in FIG. 3, the wires 37 can also directly bond each chip 33 to the connecting terminals 35, so that each chip 33 can electrically connect to and transmit signals to external devices through the wires 37 and the connecting terminals 35. In the current embodiment, the connecting terminals 35 can be conventional fingers or leads.

As mentioned above, the multi-chip package 3 can be an independent and powerful system. The functions of the multi-chip package 3 depend on the design of each chip 33. Through the connecting terminals 35, the multi-chip package 3 can receive signals from external devices to perform logic calculation or data storage, and output signals to external systems or apparatuses.

The molding compound 39 is formed with a molding process, and encapsulates at least the wires 37. In this embodiment, the molding compound 39 encapsulates the transparent substrate 31, chips 33, parts of the connecting terminals 35, and the wires 37.

Figure 4:
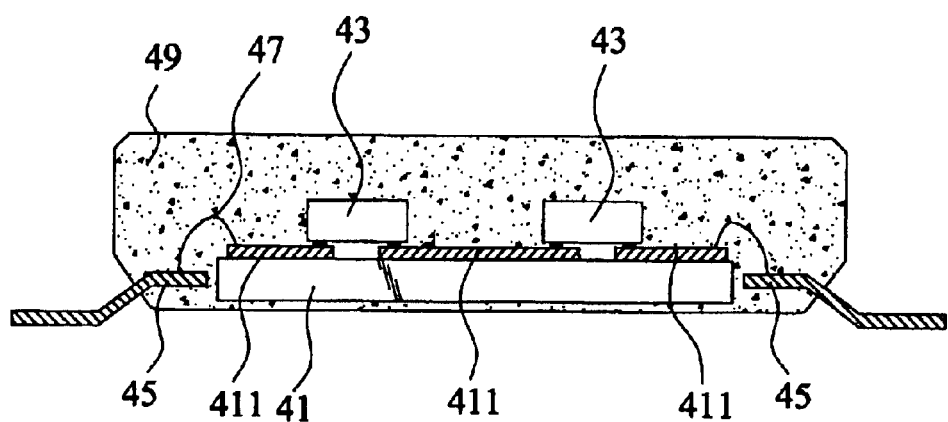
FIG. 4 is a schematic illustration showing a multi-chip package according to another preferred embodiment of the invention, wherein each chip is attached to a conductive layer of a transparent substrate by way of a flip-chip attachment.

With reference to FIG. 4, a multi-chip package 4 according to an additional preferred embodiment of the invention includes a transparent substrate 41, two chips 43, a plurality of connecting terminals 45, a plurality of wires 47, and a molding compound 49. In this embodiment, the transparent substrate 41 is a glass substrate. A conductive layer 411, which provides a circuit pattern of a desired layout, is formed on the upper surface of the transparent substrate 41. The transparent substrate 41 is similar to the previously mentioned transparent substrate 31 (as shown in FIG. 3), and is omitted in the following description.

The chips 43 are attached to the transparent substrate 41 by way of a common flip-chip attachment. In this embodiment, an anisotropic conducting film (ACF) is applied to the transparent substrate 41, and then the chips 43 are attached to the transparent substrate 41. The pads of each chip 43 electrically connect to the conductive layer 411 of the transparent substrate 41 directly. Thus, the chips 43 can communicate and transmit signals to each other through the circuit layout of the conductive layer 411. The chips 43 and the conductive layer 411 construct a desired circuitry system, and the powerful functions of the circuitry system can be then performed. In the present embodiment, each chip 43 can be a logic IC chip, a memory IC chip or an optoelectronic IC chip such as a photo diode.

The connecting terminals 45 can be located at the periphery of the transparent substrate 41, and electrically connect to the conductive layer 411 of the transparent substrate 41 through the wires 47. Therefore, each chip 43 can electrically connect and transmit signals to external devices through the conductive layer 411, the wires 47 and the connecting terminals 45. In the embodiment, the connecting terminals 45 can be conventional fingers, leads, or the likes.

A molding process is used to form the molding compound 49, which encapsulates at least the wires 47. In the embodiment, the molding compound 49 encapsulates the transparent substrate 41, chips 43, parts of the connecting terminals 45, and the wires 47.

In summary, the multi-chip package of the invention has a conductive layer or conductive layers formed on the transparent substrate such as a glass substrate. Since the technology of forming a conductive layer on a glass substrate has had successful industrial applications, the technology can also be applied in the invention to form a circuit of fine pattern on the glass substrate. In such a case, the pattern of the multi-chip package of the invention can be as small as 3 $\mu$m, which is much smaller than the minimum pattern of the conventional BGA substrate (30 $\mu$m). Thus, the multi-chip package of the invention sufficiently meets the requirements of high pin-count interconnections. In addition, forming a conductive layer on a glass substrate is a highly developed technology and use of it in manufacturing the required glass substrate of the invention results in lower cost and higher reliability than the conventional BGA substrate. As mentioned above, the glass substrate is a material having a good insulating property and a low dielectric constant, and in particular, having a good insulation property and a low dielectric constant under high frequency transmission. Therefore, when a high frequency signal is transmitted through the conductive layer of the glass substrate, high frequency signal decay caused by parasitic capacitance and parasitic leakage resistance can be reduced significantly. Thus, the quality of the entire circuit is improved accordingly especially for the multi-chip packages that include RF chips.

Moreover, since the glass substrate and the semiconductor chip have very similar thermal expansion coefficients, product reliability can be maintained when attaching chips to the glass substrate by way of a flip-chip attachment.

Furthermore, the multi-chip package of the invention has a transparent substrate, so the chips can be easily aligned to the transparent substrate when performing the flip-chip attachment process, and product optical inspection after the process can also be easily achieved. In addition, the transparent substrate can extend the applications for which the multi-chip package of the invention may be used. For example, when the chips of the multi-chip package are optical sensors or light emitters, which can transmit optical signals to or from external devices, the optical signals may pass through the transparent substrate directly. In this case, the multi-chip package of the invention can perform as an optical communication interface. Taking the multi-chip package 4 as an example, the molding compound 49 might cover only the upper part of the transparent substrate 41, leaving the bottom surface uncovered. By doing so, the chips 43 are separated from the outside only by the transparent substrate 41. Therefore, the optical signals can pass through the transparent substrate 41 and be directly transmitted between the chips 43 and external devices. Moreover, the previously mentioned pad located on the bottom of the transparent substrate 41 for carrying the transparent substrate 41 can be composed of transparent materials, so that the optical signals can be successfully transmitted.

In brief, since the multi-chip package of the invention employs a transparent substrate, such as a glass substrate, to carry several chips, the conductive layer having a circuit of fine pattern can be formed on the transparent substrate by utilizing existing manufacturing technology. In addition, the transparent substrate, especially the glass substrate, provides good insulating properties and a low dielectric constant, so that high frequency signal decay caused by parasitic capacitance and parasitic leakage resistance can be reduced. Furthermore, since the glass substrate and the semiconductor chip have very similar thermal expansion coefficients, the degraded reliability issue caused by the difference between the thermal expansion coefficients of the materials inside the multi-chip package can be prevented.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A multi-chip package, comprising:

a transparent substrate having a conductive layer for electrical inter-connection;

at least two chips mounted on the transparent substrate, wherein the chips and the conductive layer form a circuitry system and at least one of the chips is provided on the transparent substrate by a flip-chip attachment in order to permit visual inspection of the at least one chip;

a plurality of connecting terminals for electrically connecting to the circuitry system through a plurality of wires, the connecting terminals electrically connecting the circuitry system outwardly; and a molding compound for at least encapsulating the wires.

2. The multi-chip package of claim 1, further comprising:
a pad, which is provided at one side of the transparent substrate for carrying the transparent substrate.

3. The multi-chip package of claim 1, wherein the transparent substrate is a glass substrate.

4. The multi-chip package of claim 1, wherein the molding compound further encapsulates the chips.

5. The multi-chip package of claim 1, wherein the molding compound further encapsulates the transparent substrate.

6. The multi-chip package of claim 1, wherein the molding compound further encapsulates at least a part of the connecting terminals.

7. The multi-chip package of claim 1, wherein the chip provided by way of the flip-chip attachment utilizes an optical signal to communicate outwardly through the transparent substrate.

8. The multi-chip package of claim 1, wherein at least one of the chips is provided by way of a wire bonding process.

9. The multi-chip package of claim 1, wherein at least one of the connecting terminals is electrically connected to the conductive layer of the circuitry system via the wires for electrically connecting the circuitry system outwardly.

10. The multi-chip package of claim 1, wherein at least one of the connecting terminals is electrically connected to at least one of the chips via the wires for electrically connecting the circuitry system outwardly.

* * * * *